(12) United States Patent
Gadkaree et al.

(10) Patent No.: US 7,960,736 B2
(45) Date of Patent: Jun. 14, 2011

(54) GLASS-CERAMIC-BASED SEMICONDUCTOR-ON-INSULATOR STRUCTURES AND METHOD FOR MAKING THE SAME

(75) Inventors: Kishor P. Gadkaree, Big Flats, NY (US); Linda R. Pinckney, Coming, NY (US)

(73) Assignee: Corning Incorporated, Corning, NY (US)

( * ) Notice: Subject to any disclaimer, the term of this patent is extended or adjusted under 35 U.S.C. 154(b) by 0 days.

(21) Appl. No.: 12/238,784

(22) Filed: Sep. 26, 2008

(65) Prior Publication Data
US 2009/0050901 A1 Feb. 26, 2009

Related U.S. Application Data

(63) Continuation of application No. PCT/US2008/003859, filed on Mar. 25, 2008.

(60) Provisional application No. 60/920,986, filed on Mar. 30, 2007.

(51) Int. Cl.
*H01L 31/0312* (2006.01)
*H01L 27/01* (2006.01)
*H01L 27/12* (2006.01)
*H01L 31/0392* (2006.01)
*H01L 21/76* (2006.01)
*H01L 21/20* (2006.01)
*H01L 21/36* (2006.01)

(52) U.S. Cl. .......... 257/77; 257/352; 257/E21.001; 257/E27.112; 257/E29.072; 438/426; 438/480

(58) Field of Classification Search .......... 257/352, 257/E27.112, 77, E21.001, E29.072; 438/77, 438/352
See application file for complete search history.

(56) References Cited

U.S. PATENT DOCUMENTS
5,968,857 A * 10/1999 Pinckney .............. 501/10
6,335,231 B1 1/2002 Yamazaki et al.
2004/0229444 A1* 11/2004 Couillard et al. .......... 438/455

FOREIGN PATENT DOCUMENTS
EP 1798765 A2 6/2007
WO 03/097552 11/2003
WO WO2005/029576 A2 3/2005
WO 2006/023289 A2 3/2006

* cited by examiner

*Primary Examiner* — David S Blum
(74) *Attorney, Agent, or Firm* — Bruce P. Watson

(57) ABSTRACT

The present invention relates to a semiconductor-on-insulator structure including a semiconductor component comprised of substantially single-crystal semiconductor material layer and a single-crystal semiconductor material with an enhanced oxygen content layer; an oxide glass material layer; and a glass-ceramic layer.

28 Claims, 6 Drawing Sheets

GLASS-CERAMIC-BASED SEMICONDUCTOR-ON-INSULATOR STRUCTURES AND METHOD FOR MAKING THE SAME

CROSS-REFERENCE TO RELATED APPLICATIONS

This application claims the benefit of priority under 35 U.S.C. §119(e) of U.S. Provisional Application Ser. No. 60/920,986 filed on Mar. 30, 2007 and this application claims the benefit of priority under 35 U.S.C. §120 of International Patent Application Serial No. PCT/U508/03859 filed on Mar. 25, 2008 designating the United States of America.

BACKGROUND

1. Technology Field

The present invention relates generally to semiconductor structures, and more particularly to glass-ceramic containing semiconductor-on-insulator structures and methods for making glass-ceramic based semiconductor-on-insulator structures.

To date, the semiconductor material most commonly used in semiconductor-on-insulator structures has been silicon. Such structures have been referred to in the literature as silicon-on-insulator structures and the abbreviation "SOI" has been applied to such structures. The present invention relates to semiconductor-on-insulator structures in general, including silicon-on-insulator structures.

For ease of presentation, the following discussion will at times be in terms of silicon-on-insulator structures. The references to this particular type of semiconductor-on-insulator structure are made to facilitate the explanation of the invention and are not intended to, and should not be interpreted as, limiting the invention's scope in any way.

The SOI abbreviation is used herein to refer to semiconductor-on-insulator structures in general, including, but not limited to, silicon-on-insulator structures. Similarly, the SOG abbreviation is used to refer to semiconductor-on-glass structures in general, including, but not limited to, silicon-on-glass structures. The SOG nomenclature is also intended to include semiconductor-on-glass-ceramic structures, including, but not limited to, silicon-on-glass-ceramic structures. The abbreviation SOI encompasses SOGs.

2. Technical Background

Silicon-on-insulator technology is becoming increasingly important for high performance thin film transistors, solar cells, and displays, such as, active matrix displays. The silicon-on-insulator wafers consist of a thin layer of substantially single crystal silicon (generally 0.1-0.3 microns in thickness but, in some cases, as thick as 5 microns) on an insulating material.

Various ways of obtaining such a wafer include epitaxial growth of Si on lattice matched substrates; bonding of a single crystal silicon wafer to another silicon wafer on which an oxide layer of $SiO_2$ has been grown, followed by polishing or etching of the top wafer down to, for example, a 0.1 to 0.3 micron layer of single crystal silicon; or ion-implantation methods in which either hydrogen or oxygen ions are implanted either to form a buried oxide layer in the silicon wafer topped by Si in the case of oxygen ion implantation or to separate (exfoliate) a thin Si layer to bond to another Si wafer with an oxide layer as in the case of hydrogen ion implantation. Of these three approaches, the approaches based on ion implantation have been found to be more practical commercially. In particular, the hydrogen ion implantation method has an advantage over the oxygen implantation process in that the implantation energies required are less than 50% of that of oxygen ion implants and the dosage required is two orders of magnitude lower.

Exfoliation by the hydrogen ion implantation method was initially taught in, for example, Bister et al., "Ranges of the 0.3-2 MeV H$^+$ and 0.7-2 MeV H$_2^+$Ions in Si and Ge," *Radiation Effects*, 1982, 59:199-202, and has been further demonstrated by Michel Bruel. See Bruel, U.S. Pat. No. 5,374,564; M. Bruel, *Electronic Lett.* 31, 1995 pp 1201-1202; and L. Dicioccio, Y. Letiec, F. Letertre, C. Jaussad and M. Bruel, *Electronic Lett.* 32, 1996, pp 1144-1145.

The method typically consists of the following steps. A thermal oxide layer is grown on a single crystal silicon wafer. Hydrogen ions are then implanted into this wafer to generate subsurface flaws. The implantation energy determines the depth at which the flaws are generated and the dosage determines flaw density. This wafer is then placed into contact with another silicon wafer (the support substrate) at room temperature to form a tentative bond. The wafers are then heat-treated to about 600° C. to cause growth of the subsurface flaws for use in separating a thin layer of silicon from the Si wafer. The resulting assembly is then heated to a temperature above 1,000° C. to fully bond the Si film with $SiO_2$ underlayer to the support substrate, i.e., the unimplanted Si wafer. This process thus forms a silicon-on-insulator structure with a thin film of silicon bonded to another silicon wafer with an oxide insulator layer in between.

Cost is an important consideration for commercial applications of SOI structures. To date, a major part of the cost of such structures has been the cost of the silicon wafer which supports the oxide layer, topped by the Si thin film, i.e., a major part of the cost has been the support substrate. In discussing support substrates, some of the above references have mentioned quartz glass, glass, and glass-ceramics. Other support substrate materials listed in these references include diamond, sapphire, silicon carbide, silicon nitride, ceramics, metals, and plastics.

Although glass and glass-ceramics had been disclosed in the prior art as a alternative to silicon as the base wafer, no practical techniques for forming SOI structures using glass or glass-ceramics as support substrates in had been developed.

U.S. Pat. Nos. 7,176,528 and 7,192,844, SOI structures, that have one or more regions composed of a layer of a substantially single-crystal semiconductor (e.g., doped silicon) attached to a support substrate composed of an oxide glass or an oxide glass-ceramic. The oxide glass or oxide glass-ceramic is preferably transparent and preferably has a strain point of less than 1000° C., a resistivity at 250° C. that is less than or equal to $10^{16}$ Ω-cm, and contains positive ions (e.g., alkali or alkaline-earth ions) which can move within the glass or glass-ceramic in response to an electric field at elevated temperatures (e.g., 300-1000° C.).

Although these oxide glass or an oxide glass-ceramic based SOI structures were an improvement over the aforementioned prior art SOI structures, the glasses utilized in this oxide glass oxide glass or an oxide glass-ceramic based SOI structures can not withstand the high temperature processing utilized in high performance display or electronic applications without a resulting deformation of the substrate; e.g. the growth of high temperature thermal gate oxides which are used to allow high performance TFTs to be fabricated on the silicon film.

US Pat App. 2006/0038228 co-assigned to the current assignee, addresses this issue. This reference discloses semiconductor-on-insulator structure that exhibit a first layer including a semiconductor material, attached to a second layer including a glass or glass-ceramic, with the strain point of the glass or glass-ceramic equal to or greater than about 800° C. These structures are capable of being used in these high performance display or electronic applications, yet are significantly lower cost to manufacture than the prior art silica/quartz-based SOI structures, thus satisfying the demand in the high performance display or electronic fields for lower cost SOI structures and resultant devices.

Although these oxide glass or glass-ceramic based SOI structures were an improvement over the aforementioned prior art SOI structures, the glass-ceramic based semiconductor on insulator structures were difficult to produce and did result in strongly bonded structures having a sufficiently large in situ barrier layer due, in part, to the lack of mobile ions in the glass ceramic which was cerammed/crystallized prior to the bonding of the glass-ceramic substrate to the silicon.

The present invention improves upon these prior art glass-ceramic based SOI structures and provides for novel glass-ceramic based SOI structures which are strongly bonded and exhibit a sufficiently large barrier layer. These glass-ceramic based SOI structures are capable of being used in the aforementioned high performance display or electronic applications.

SUMMARY

One embodiment of the present invention relates to a semiconductor-on-insulator structure including a semiconductor component comprised of substantially single-crystal semiconductor material layer and a single-crystal semiconductor material with an enhanced oxygen content layer; an oxide glass material layer; and a glass-ceramic layer.

A further embodiment relates to semiconductor-on-insulator layered structure comprising a substantially single-crystal semiconductor material and an oxide containing material. The single crystal semiconductor material is comprised of two layers: a layer comprised single crystal semiconductor material and a layer comprising single crystal semiconductor material with an enhanced oxygen content. The oxide containing material is comprised of the following layers: (1) a layer comprising an oxide glass material with a reduced positive ion concentration having substantially no modifier positive ions; (2) a layer comprising glass-ceramic material with an enhanced positive ion concentration of modifier positive ions, including at least one alkaline earth modifier ion from the oxide glass material with a reduced positive ion concentration; and, (4) a layer comprising bulk glass ceramic material.

In either of the aforementioned semiconductor-on-insulator structure embodiments the glass-ceramic comprises a spinel or mullite crystal phase wherein the spinel or mullite glass-ceramic exhibits a coefficient of thermal expansion between about 22-42×10$^{-7}$/° C. over the temperature range of 25-300° C. In a further embodiment the spinel or mullite glass-ceramic exhibits a coefficient of thermal expansion between about 35-40×10$^{-7}$/° C. over the temperature range of 25-300° C.

In accordance with one or more aspects of the present invention, a process for forming the aforementioned semiconductor on glass-ceramic/insulator structures includes: subjecting an implantation surface of a donor semiconductor wafer to an ion implantation process to create an exfoliation layer of the donor semiconductor wafer; bonding the implantation surface of the exfoliation layer to a glass substrate using electrolysis; separating the exfoliation layer from the donor semiconductor wafer to thereby form an intermediate semiconductor on precursor glass structure; subjecting the intermediate semiconductor on precursor glass structure to heat-treatment step to crystallize the precursor glass resulting in the formation of a semiconductor on glass-ceramic structure.

The semiconductor-on-insulator structures and methods for making semiconductor-on-insulator structures of the present invention result in a number of advantages over prior art. The present invention satisfies the longstanding need in the art for lower cost substrates for use in high performance and electronic applications, when compared to fused silica or quartz based SOI structures. More particularly, the incorporation of the glass-ceramic allows the SOI wafer to be subject to high temperature processes such as thermal gate oxide without the deformation that would be expected with the prior art lower temperature strain point glasses. Additionally, the utilization of these high strain point glass or glass-ceramic as the substrate material for the SOI structures results in a minimized substrate compaction (i.e., dimensional change) which is typically experienced for lower strain point substrate materials during the TFT fabrication process.

Additional features and advantages of the invention will be set forth in the detailed description which follows, and in part will be readily apparent to those skilled in the art from the description or recognized by practicing the invention as described in the written description and claims hereof, as well as in the appended drawings.

It is to be understood that both the foregoing general description and the following detailed description are merely exemplary of the invention, and are intended to provide an overview or framework for understanding the nature and character of the invention as it is claimed.

The accompanying drawings are included to provide a further understanding of the invention, and are incorporated in and constitute a part of this specification. The drawings are not necessarily to scale, and sizes of various elements may be distorted for clarity. The drawings illustrate one or more embodiment(s) of the invention, and together with the description serve to explain the principles and operation of the invention.

DETAILED DESCRIPTION OF THE EXEMPLARY EMBODIMENTS

Figure 1:
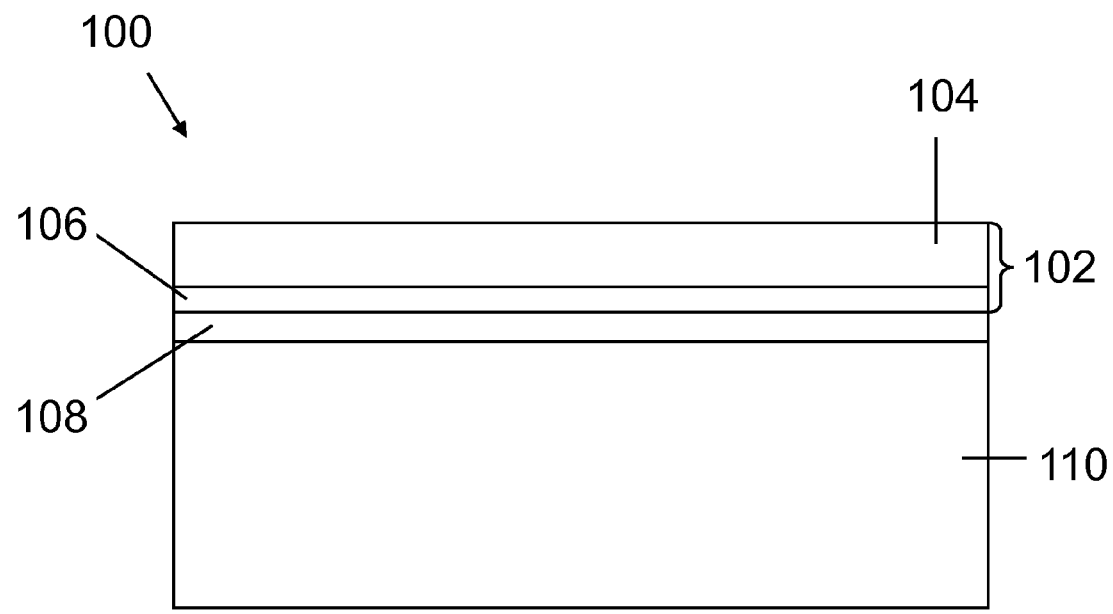
FIG. 1 is a schematic cross-sectional view of a semiconductor-on-glass-ceramic structure according to one embodiment of the present invention.

With reference to the drawings, wherein like numerals indicate like elements, there is shown in FIG. 1 an SOG layered structure 100 in accordance with one or more embodiments of the present invention. The SOG structure 100 preferably includes a semiconductor component 102 comprised of a substantially single crystal semiconductor material layer 104 and a single-crystal semiconductor material with an enhanced oxygen content layer 106. The SOG layered structure further includes a third layer 108 which comprises an oxide glass material, and a fourth layer 110 which comprises a glass-ceramic material.

Figure 2:
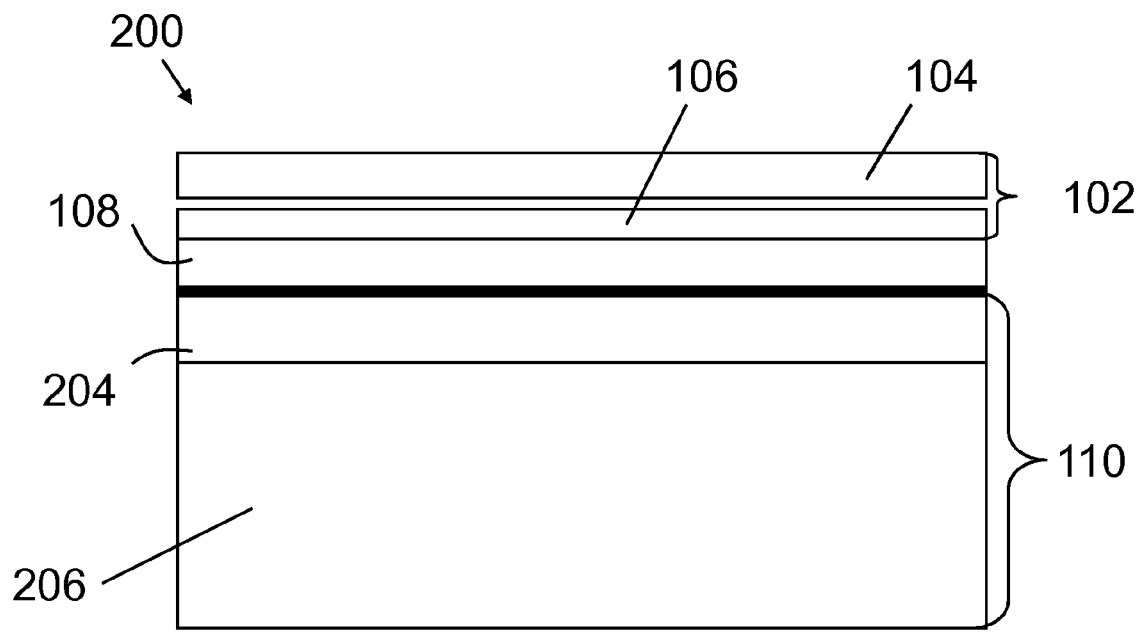
FIG. 2 is a schematic cross-sectional view of a semiconductor-on-glass-ceramic structure according to another embodiment of the present invention.

Reference is now made to FIG. 2 wherein is shown another embodiment of an SOG layered structure 200 of the present invention. The SOG structure 200 is comprised of a five-layer structure comprising a 2 layer semiconductor component 102, an oxide glass layer 108 and a two-layer oxide glass-ceramic substrate 110 which comprises positive ions. Specifically, the SOG layered structure 200 is comprised of the following layers: (1) a substantially single-crystal semiconductor material layer 104; (2) a semiconductor barrier layer 106 with an enhanced oxygen content; (3) an oxide glass material barrier layer 108; (4) an oxide glass-ceramic layer 204 with an enhanced positive ion concentration of modifier positive ions, including at least one alkaline earth modifier ion from the oxide glass material layer 108 with a reduced positive ion concentration; and, (5) an oxide glass-ceramic layer 206 comprised of glass ceramic having a bulk concentration.

The semiconductor on glass-ceramic structure is capable of high use temperature in excess of 1000° C., thus allowing applications in RF/high performance electronics, Photovoltaics, Digital Imaging, etc. which are not possible with prior art silicon on glass products.

The semiconductor-on-glass-ceramic structures of the present invention can be made with virtually any desirable semiconductor, glass and glass-ceramic layer thicknesses. For example, the each of the layers desirably has a thickness less than about 1 mm. More desirably, the semiconductor layers desirably have a thickness less than about 1 µm. In certain desirable embodiments of the invention, the first semiconductor component has a thickness between about 10 nm and 500 nm. The glass and glass-ceramic layer each desirably has a thickness between about 0.1 mm and about 10 mm. More desirably, the glass-ceramic layer has a thickness between about 0.5 mm and about 1 mm. For some applications of semiconductor-on-glass-ceramic structures, glass-ceramic layers having a thickness greater than or equal to 1 µm are desirable, e.g., to avoid parasitic capacitive effects which arise when standard semiconductor-on-insulator structures having a silicon/$SiO_2$/silicon configuration are operated at high frequencies. In the past, such thicknesses have been difficult to achieve In general terms, the glass-ceramic layer needs to be thick enough to support the semiconductor component through the process steps of the invention, as well as subsequent processing performed on the semiconductor-on-glass-ceramic structure. Although there is no theoretical upper limit on the thickness of the glass-ceramic substrate, a thickness beyond that needed for the support function or that desired for the ultimate semiconductor-on-glass-ceramic structure is generally not preferred since the greater the thickness of the precursor glass and so-formed glass-ceramic substrate, the lower the electric field strength within the substrate during later-described bonding step (B, specifically the voltage application of B3) of the method of the method described herein below and in U.S. Pat. No. 7,192,844 for the same applied voltage difference.

The semiconductor material in the semiconductor layer/component can be a silicon-based semiconductor material, or can be any other suitable type of semiconductor material, such as a III-V semiconductor, a II-IV semiconductor, a II-IV-V semiconductor, or a IV semiconductor. Examples of silicon-based semiconductor materials suitable for use as the semiconductor material of the first layer include silicon (e.g., undoped silicon, n-doped silicon, p-doped silicon); germanium-doped silicon (SiGe); and silicon carbide (SiC). Examples of other semiconductor materials which can be used in the first layer include Ge-, GaAs-, GaP-, and InP-based materials. The semiconductor layer material can have a wide range of CTEs depending on the material. For example, the semiconductor material of the first layer can have a CTE (25° C.) between about $20 \times 10^{-7}$/° C. and about $70 \times 10^{-7}$/° C.

The semiconductor material layer is in the form of a substantially single-crystal material. The word "substantially" is used in describing the first layer to take account of the fact that semiconductor materials normally contain at least some internal or surface defects either inherently or purposely added, such as lattice defects or a few grain boundaries. The word "substantially" also reflects the fact that certain dopants may distort or otherwise affect the crystal structure of the bulk semiconductor material.

The glass precursor and the so-formed glass barrier layer 108 and the glass-ceramic substrate 110 are formed from an oxide-based glass. Although not required, the embodiments described herein preferably include an oxide glass or glass-ceramic exhibiting a strain point of greater than 900° degrees C. As is conventional in the glass making art, the strain point is the temperature at which the glass or glass-ceramic has a viscosity of $10^{14.6}$ poise ($10^{13.6}$ Pa·s).

The oxide glass barrier layer and the glass-ceramic layer are desirably formed from a silica-based glass precursor. In one embodiment, $SiO_2$ is present in the precursor glass and so-formed glass-ceramic at a concentration of at least about 50 wt. %. In a still further embodiment, $SiO_2$ is present in a concentration of at least about 55 wt %. Glass-ceramics suitable for use in the present invention include those which exhibit the crystalline phases mullite and spinel.

For certain applications, e.g., display applications, the glass-ceramic is desirably substantially transparent in the visible, near UV, and/or near IR wavelength ranges. For example, the glass-ceramic is desirably substantially transparent in the 350 nm to 2 µm wavelength range.

The precursor glass (for forming the subsequent glass-ceramic layer and the oxide glass barrier layer) can be produced from conventional raw materials using a variety of techniques familiar to the skilled artisan, and can be attached to the semiconductor layer/component using the methods described herein below, and in U.S. Pat. No. 7,192,844, entitled "GLASS-BASED SOI STRUCTURES", which is hereby incorporated herein by reference in its entirety.

In certain embodiments of the invention, the precursor glass desirably includes at least some positive ions which during the bonding step (Step B, and particularly the voltage application of Step B3) of the method described herein below and in U.S. Pat. No. 7,192,844, move in the direction of the applied electric field, i.e., away from the interface between the bonded first (semiconductor) and second (precursor glass) layers and toward the back side of the second layer. Alkali ions, e.g., $Li^+$, $Na^+$, and/or $K^+$ ions, are suitable positive ions for this purpose because they generally have higher mobilities than other types of positive ions typically incorporated in glasses and glass-ceramics. Precursor glasses having no alkali ions are preferred for use in the present invention, though small amounts of alkali are acceptable for certain applications. For example, glasses having other mobile ions, such as alkaline-earth ions (e.g., $Ca^{2+}$, $Mg^{2+}$, $Ba^{2+}$, $Sr^{2+}$) or other positive ions such as $Ag^+$, $C^+$, $Zn^{2+}$ and various transition metal ions are preferred in the second layer in the semiconductor-on-insulator structures of the present invention.

In embodiments of the invention in which the precursor glass contains alkali or alkaline-earth ions, the concentrations of alkali and alkaline-earth ions can vary over a wide range, representative concentrations being between 0.1 and 40 wt % on an oxide basis. Desirable alkali and alkaline-earth ion concentrations are 0.1-5 wt % on an oxide basis in the case of alkali ions. Many nominally alkali-free glasses have tens to hundreds of ppm of alkali contaminant, which can move during step B3 of the method described herein below.

The precursor glass (for forming the subsequent glass-ceramic layer 110 and the oxide glass barrier layer 108) for use in the inventive SOI structures includes a family of transparent glasses within the following composition, as calculated in weight percent on an oxide basis: 50-65% $SiO_2$, 15-25% $Al_2O_3$, 6-15% ZnO, 0-6% MgO, 0-10% $TiO_2$, 0-10% ZrO, 0-15% $Cs_2O$, 0-5% BaO, ZnO+MgO in combination being greater than or equal to about 8%, and $TiO_2+ZrO_2$ in combination being greater than about 4%. Representative compositions for use in the present invention are detailed in Table I The so-formed glass-ceramic material layers 110 contain spinel as the predominant crystal phase. By predominant crystal phase, it is meant that this crystal phase is at least about 75 volume percent, more preferably at least 85 percent, and most preferably at least 95 percent of the total crystalline phases present. The glass-ceramics of the present invention are at least about 20 weight percent crystalline phases dispersed within a glassy matrix.

Preferably, the glass oxide barrier layer 108 and the glass-ceramic substrate 110 exhibit coefficients of thermal expansion between about $22-42\times10^{-7}/°$ C., over the temperature range of 25-300° C., more preferably between about $30-42\times10^{-7}/°$ C., and most preferably between about $35-40\times10^{-7}/°$ C., providing a close thermal expansion match to silicon. By transparent it is meant that 1.1 mm thick sheets of the glass-ceramics of the present invention exhibit greater than 85 percent transmittance over the visible region (400 nm to 700 nm) of the spectrum. Preferably, for certain applications, it is also desirable that these sheets exhibit some transmittance in the near ultraviolet as well, for example, greater than 50 percent over the region 350-400 nm Transparent glass-ceramic materials containing spinel as the predominant crystal phase are described in more detail in U.S. Pat. No. 5,968,857 entitled "Glass-Ceramics", which is hereby incorporated herein by reference in its entirety.

ductor-on-insulator structure can withstand the processing associated with the manufacture of thin film transistors and other devices within or on the structure. The bond strength between the semiconductor component and the precursor substrate (and ultimately between the semiconductor and the oxide glass layer in final semiconductor-on-glass-ceramic) is desirably at least 8 $J/m^2$. More desirably, the bond strength between the bonded layers is at least 10 $J/m^2$. In certain especially desirable embodiments of the invention, the bond strength is at least 15 $J/m^2$. Bond energies can be determined using indentation measurements, which can be performed using a Nano Indenter II (MTS Systems Corporation, Eden Prairie, Minn.) equipped with a Berkovich diamond indenter. As the skilled artisan will appreciate, other equipment can be used to perform indentation measurements. Indentations are to be made covering a range of loads, and the region immediately surrounding the indentation is to be examined for evidence of delamination. Calculation of bond energy is made in accordance with D. B. Marshall and A. G. Evans, "Measurement of Adherence of Residually Stressed Films by Indentation. I. Mechanics of Interface Delamination", J. Appl. Phys, 56[10] 2632-2638 (1984), the relevant portions of which are hereby incorporated herein by reference. Further details of the bond energy determination can be found in U.S. patent application Ser. No. 10/779,582.

Figure 3:
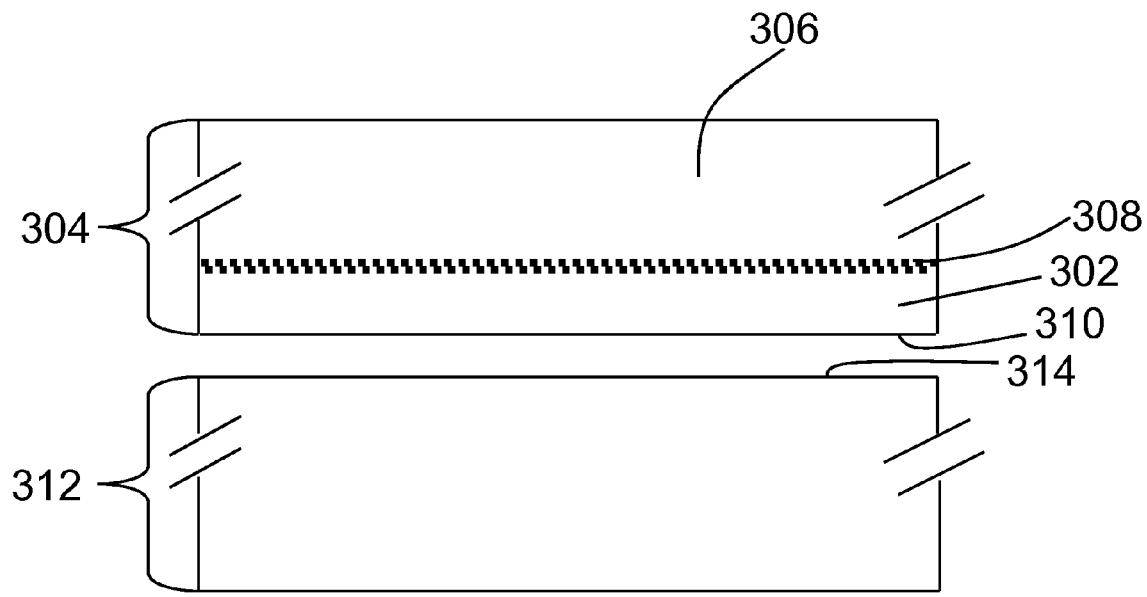
FIGS. 3-6 are schematic cross-sectional views of steps of a method for making a semiconductor-on-insulator structure according to one embodiment of the present invention.

The methods described herein below and in U.S. Pat. No. 7,176,528, the entire disclosure of which is hereby incorporated by reference, allow the skilled artisan to make semiconductor-on-glass-ceramic structures. With reference to FIG. 3, a donor semiconductor is subject to ion implantation, and thereafter a precursor glass substrate and the implanted donor semiconductor wafer are then subject to an electrolysis bonding process, followed by separation of a portion of the donor semiconductor wafer to form an intermediate structure comprising a precursor glass substrate having a thin semiconductor layer thereon. Portions of this electrolysis are discussed below, however, the basic process involves subjecting the precursor glass substrate 102 and donor semiconductor wafer 120 to temperature, voltage, and pressure for some period of time.

FIG. 3 illustrates process steps that may be carried out in order to produce an intermediate structure in connection with fabricating the semiconductor on glass-ceramic structure 100 and 200 of FIGS. 1 and 2, respectively. First step (Step A), involves creating an exfoliation layer 302 in the donor semi-

TABLE I

| Composition (wt %) | Example 1 | Example 2 | Example 3 | Example 4 | Example 5 | Example 6 | Example 7 |
|---|---|---|---|---|---|---|---|
| $SiO_2$ | 60.3 | 58.3 | 57.0 | 55.0 | 57.0 | 57.3 | 59.3 |
| $Al_2O_3$ | 19.0 | 20.2 | 18.0 | 21.0 | 21.8 | 18.5 | 19.1 |
| ZnO | 9.0 | 8.4 | 14.0 | 13.5 | 14.0 | 11.6 | 9.0 |
| MgO | 2.1 | 4.2 | — | — | — | 2.4 | 2.5 |
| BaO | 2.1 | — | — | — | 2.1 | 2.0 | 2.1 |
| $Cs_2O$ | — | 4.0 | 4.0 | — | — | — | — |
| $TiO_2$ | — | 3.0 | — | 5.5 | 5.2 | 5.0 | 5.0 |
| $ZrO_2$ | 7.5 | 5.0 | 7.0 | — | — | 3.0 | 3.0 |
| $As_2O_5$ | 1.0 | 1.0 | 1.0 | 1.0 | 1.0 | 1.0 | 1.0 |
| Crystal Phase | spinel | spinel | spinel | spinel | spinel | spinel | spinel |
| Strain Point (° C.) | >900 | >900 | >900 | >900 | >900 | >900 | >900 |
| CTE($\times 10^{-7}/°$ C.) | 37 | 38 | 37 | 37 | 37 | 38 | 37 |

As will be appreciated by the skilled artisan, the strength of the bond between the single crystal semiconductor material and the oxide containing material is a key property of a semiconductor-on-insulator structure. High bond strength and durability are very important to ensure that the semiconconductor wafer 304. For the purposes of discussion, the donor semiconductor wafer 304 is preferably a substantially single crystal Si wafer.

The exfoliation layer 302 is preferably a relatively thin layer of silicon that may be separated from the remaining portion of the Si semiconductor donor wafer 306 following the bonding and separation steps (Steps B and D which will be discussed later herein). Although the embodiments of the present invention are not limited to any particular method of forming the exfoliation layer, one suitable method includes the use of ion implantation to create a weakened region 308 below the surface 310 of the silicon wafer 304. By way of example, hydrogen ion implantation may be employed, although other ions or multiples thereof may be employed, such as boron+hydrogen, helium+hydrogen, or other ions known in the literature for exfoliation. Again, any other known or hereinafter developed technique suitable for forming the exfoliation layer 302 may be employed without departing from the spirit and scope of the present invention.

In one embodiment a single step hydrogen implantation alone is used and involves subjecting the Si wafer to an H ion implant dosage of between $1 \times 10^{16}$-$1 \times 10^{17}$ ions/cm$^2$. In another, low dosage embodiment, the Ge wafer is subject to multiple ion, low dosage, implant steps. Particularly, a combination H and He low dosage implantation is utilized and involves first subjecting the Ge wafer to an H ion implant dosage ranging between $1 \times 10^{15}$ to $5 \times 10^{16}$ ions/cm$^2$, followed by a Helium implant dosage, again at low dosage level ranging between $1 \times 10^{15}$ to $5 \times 10^{16}$ ions/cm$^2$.

No matter what technique is employed to create the exfoliation layer 302, the Si donor wafer 304 is preferably treated to reduce the (e.g., hydrogen) ion concentration on the surface 310. For example, the donor semiconductor wafer 304 is preferably washed and cleaned and the exfoliation layer surface 310 is preferably subject to mild oxidation. The mild oxidation treatments may include treatment in oxygen plasma, ozone treatments, treatment with hydrogen peroxide, hydrogen peroxide and ammonia, hydrogen peroxide and an acid or a combination of these processes. It is expected that during these treatments hydrogen terminated surface groups oxidize to hydroxyl groups, which in turn also makes the surface of the silicon wafer hydrophilic. The treatment is preferably carried out at room temperature for the oxygen plasma or ozonated water and at temperature between 25-150° C. for the ammonia or acid treatments.

Regarding the precursor glass wafer 312, it is washed in a detergent followed by distilled water and thereafter further washed with nitric acid and again followed by distilled water.

It should be noted that these treatments are optimum. If hydrogen ion concentration is not reduced there is a repulsive force between the silicon and glass wafers which may be overcome during the bonding process via application of higher pressure.

Following ion implantation, the respective structures are preferably bonded together using an electrolysis bonding process (Step B). A preferred electrolysis bonding process is described in U.S. Pat. No. 7,192,844, where portions of this process are discussed below.

Figure 4:
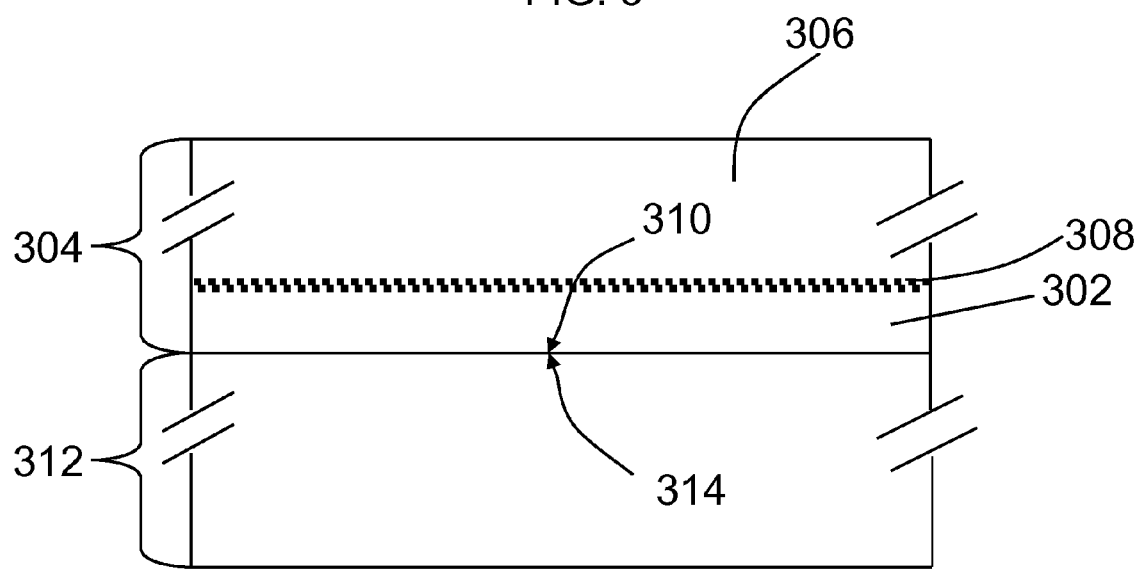

Initially, appropriate surface cleaning of the respective donor wafer surface 310 and precursor glass substrate surface 314 is preferably carried out. Thereafter, the donor wafer surface 310 and precursor glass substrate surface 314 are brought into direct or indirect contact (Step B1) to achieve the arrangement schematically illustrated in FIG. 4.

Figure 5:
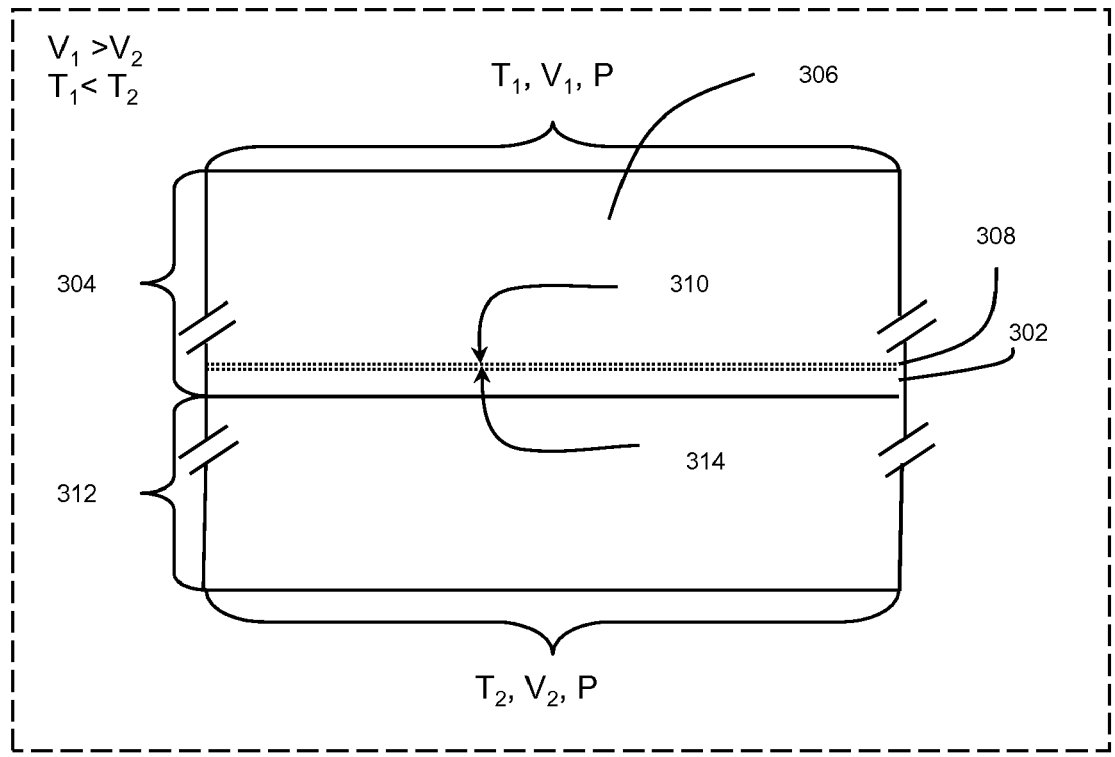

Referring now to FIG. 5, prior to or after the contact, the structure(s) comprising the donor Si semiconductor wafer 304, the exfoliation layer 302 and the precursor glass substrate 312 are heated (Step B2) under a differential temperature gradient; $T_1$ and $T_2$ respectively. Preferably the precursor glass substrate 312 is heated to a higher temperature ($T_2$) than the Si donor semiconductor wafer 304 and exfoliation layer 302 ($T_1$). By way of example, the temperature difference between the precursor glass substrate 304 and the donor Si semiconductor wafer 304 is at least 1° C., although the difference may be as high as about 100 to about 150° C. This temperature differential is desirable for a glass having a coefficient of thermal expansion (CTE) matched to that of Silicon since it facilitates later separation of the exfoliation layer 302 from the remaining donor semiconductor wafer 306 due to thermal stresses.

Once the temperature differential between the precursor glass substrate 312 and the Si donor semiconductor wafer 304 is stabilized, mechanical pressure is applied to the bonded assembly. In one embodiment, the pressure range is between about 1 to about 50 psi. Application of higher pressures, e.g., pressures above 100 psi, might cause breakage of the glass wafer.

The precursor glass substrate 312 and the Si semiconductor wafer 304 are ideally taken to a temperature within about +/−150° C. of the strain point of the precursor glass substrate 304.

Next, a voltage (V1/V2) is applied across the precursor glass/donor wafer intermediate assembly, with the Si semiconductor donor wafer 304 at the positive electrode (V1) and the glass substrate 312 the negative electrode (V2); Step B3. The application of the voltage potential causes alkaline earth ions (or alkali ions) in the glass substrate 312 to move away from the Si semiconductor/precursor glass interface 310/314 further into the glass substrate 312. More particularly, substantially all of the modifier positive ions of the glass substrate 312 migrate away from the higher voltage potential of the Si semiconductor donor wafer 304. This accomplishes two functions: (i) an alkaline earth (or alkali) ion free interface 310/314 is created; and (ii) the precursor glass substrate 312 becomes very reactive and bonds to the Si semiconductor layer 304 strongly with the application of heat at relatively low temperatures.

Figure 6:
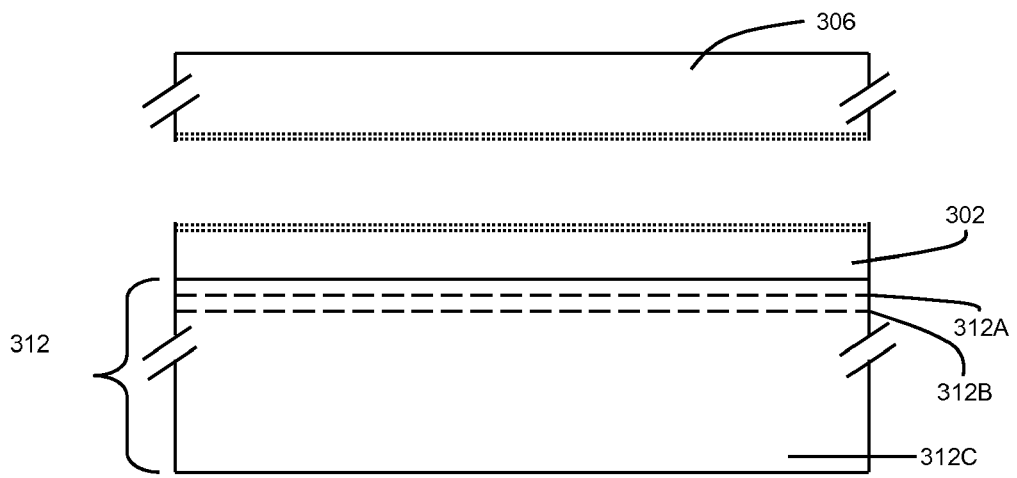

Referring now to FIG. 6, after the intermediate semiconductor on a (precursor) glass substrate structure is held under these conditions for some time (e.g., approximately 1 hr or less), the voltage is removed and the intermediate structure is allowed to cool to room temperature. The Si remaining semiconductor wafer 306 is separated from the exfoliation layer 302 which is left bonded to the precursor glass substrate 312 (Step C); this may include some peeling if they have not already become completely free. Separation may occur as temperature is ramped up, at a dwell temperature, or as temperature is ramped down. Following separation what is obtained is intermediate semiconductor on a (precursor) glass substrate 320; essentially a thin Si semiconductor/exfoliation layer 302 bonded to a glass substrate 312 as illustrated in FIG. 6. Again, it should be noted that the precursor glass substrate bonded to the Si semiconductor layer exhibits a reduced positive ion concentration layer 312A, an enhanced positive ion concentration layer 312B, adjacent the reduced positive ion concentration layer 312A, and a bulk glass layer 312C.

The separation is preferably accomplished via fracture of the exfoliation layer 302 due to thermal stresses. Alternatively or in addition, mechanical stresses such as water jet cutting or chemical etching may be used to facilitate the separation.

It should be noted that the atmosphere during the bonding (heating and application of voltage) process may be either an inert atmosphere, such as nitrogen and/or argon or simply an ambient air atmosphere.

The intermediate semiconductor on a (precursor) glass substrate 312 is then cerammed via a heat treatment step in an inert atmosphere such as argon; Step D (Not shown). The ceramming or heat-treatment step generally follows a heat treatment cycle where the wafer is held at a certain temperature to nucleate the crystals followed by a higher temperature hold for crystal growth. In a separate embodiment a heat treatment that does not involve nucleation hold temperature may be utilized; in this embodiment the ramp up schedule to the crystal growth hold temperature is sufficiently slow to achieve the necessary nucleation of the crystals: a rate no greater than 50° C./hr is capable of accomplishing this, nucleation hold-free, crystal growth.

In one embodiment the cerramming or heat-treatment schedule for a spinel glass-ceramic-based semiconductor-on-glass ceramic structure, is as follows: nucleation hold is at 800 C for 2 hours followed by crystal growth hold at 100° C. for 4 hours.

As a result of the heat-treatment a portion of the precursor glass substrate remains glass and a portion is converted to a glass-ceramic structure. This is further illustrated in FIG. 6. Specifically, the portion which remains an oxide glass is that portion of the glass closest to the semiconductor, the aforementioned reduced positive ion concentration layer 312A. This is due to the fact that there is a lack of spinel forming cations Zn, Mg in this portion of the precursor glass 312 due to the fact that all the positive modifier ions have moved away from the interface as a result of the bonding process. At some depth into the precursor glass (specifically that portion of the precursor glass material with an enhanced positive ion concentration 312B) there are sufficient ions to enable crystallization of that glass portion so as to form glass-ceramic layer 312B with an enhanced positive ion concentration. It follows that the remaining precursor glass portion (the bulk glass portion 312C) also possesses sufficient spinel forming cations to achieve crystallization. The resultant glass-ceramic structure is thus a two layer glass-ceramic portion comprised of a layer having an enhanced positive ion concentration 312B, which is adjacent the remaining oxide glass layer 312A, and a bulk glass-ceramic layer 312C.

The crystallized glass ceramic with silicon film on top has advantages over the glass based compositions in that the glass ceramic based wafers are capable of sustaining significantly higher temperatures during device fabrication or other processing. Furthermore, the high temperatures capability to allow sepitaxial growth of silicon or other semiconductors on the semiconductor-on-glass-ceramic wafer.

Example

The present invention is further described by the following non-limiting example.

A 100 mm diameter, 100 microns thick silicon wafer was implanted with hydrogen ions at dosage of $8 \times 10^{16}$ ions/cm2 and implantation energy of 100 KeV using commercially available, room temperature ion implantation techniques. The implanted wafer was then treated in oxygen plasma to oxidize the surface groups.

A 100 mm in diameter precursor glass wafer was produced and comprised the composition of Example 1 detailed in Table I; specifically, in weight percent—60.3% $SiO_2$, 19% $Al_2O_3$, 2.1% MgO 2.1% BaO, 1.0% $As_2O_5$, 7.5% $ZrO_2$ and 9.0% ZnO. The precursor glass wafer was then ultrasonically washed for 15 minutes in detergent utilizing a Fischer Scientific Contrad 70 apparatus. Thereafter the precursor glass wafer was placed in a distilled water rinse, subjected to an ultrasonic bath for 15 minutes, soaked in 10% nitric acid for a period of 1 hour, and finally rinsed again in distilled water.

Both the silicon and precursor glass wafers were finally cleaned in spin washer dryer utilizing distilled water and thereafter were allowed to dry in a clean room. The two wafers were brought into contact to create a room temperature pre-bond and then placed in a Suss Microtech bonder. The precursor glass wafer was placed on the "negative" electrode and the silicon wafer was placed on the "positive" electrode.

The two wafers were then differentially heated in vacuum atmosphere ($10^{-3}$ millibars); the silicon wafer to a temperature of 545° C. and the precursor glass wafer to a temperature and 595° C. Thereafter the wafers were subject to a potential of 1750 Volts which was applied across the wafer surfaces. The wafers were held under these conditions for a period of 20 minutes. Following this sustained application of voltage, the voltage was brought to zero and the wafers were cooled to room temperature.

Following cooling it was observed that the wafers could be separated easily, resulting in a thin layer of silicon bonded to the precursor glass wafer. Specifically, it was observed that an excellent quality sample with a strongly adhered thin silicon film (500 nm) on glass wafer surface was obtained via this process.

The so-produced intermediate silicon-on-glass sample was then subjected to heat treatment in an argon atmosphere at 800° C. for a period of 2 hours followed by further treatment at 1000° C. for 4 hours to crystallize the glass wafer portion of the silicon on glass so as to produce a silicon on glass-ceramic structure. It should be noted that the silicon film layer of so-produced silicon on glass-ceramic structure remained intact and did not delaminate or crack.

The silicon on glass-ceramic structure so-produced by the techniques above was subjected to a ToF-SIMS analysis as follows. Two ion beams were employed using the dual beam strategy—one for intermittent sputtering and another for analyzing the newly created surface. Analysis was performed using a TRIFT II instrument manufactured by Physical Electronics, Inc., Eden Prairie, Minn. A low energy Cs beam was used to sputter in synchronization with a pulsed Ga beam for analysis. A small piece of the sample was cleaved to fit the ToF-SIMS sample holder (~1 cm²). A 5 kV $^{133}Cs^+$ beam was used for sputtering in conjunction with 15 kV, 600 pA $^{69}Ga^+$ beam for analysis. The Cs beam was rastered over 500 μm×500 μm area of the sample; the Ga beam analyzed a 50 μm×50 μm window at the center of the Cs-sputtered region.

Figure 7:
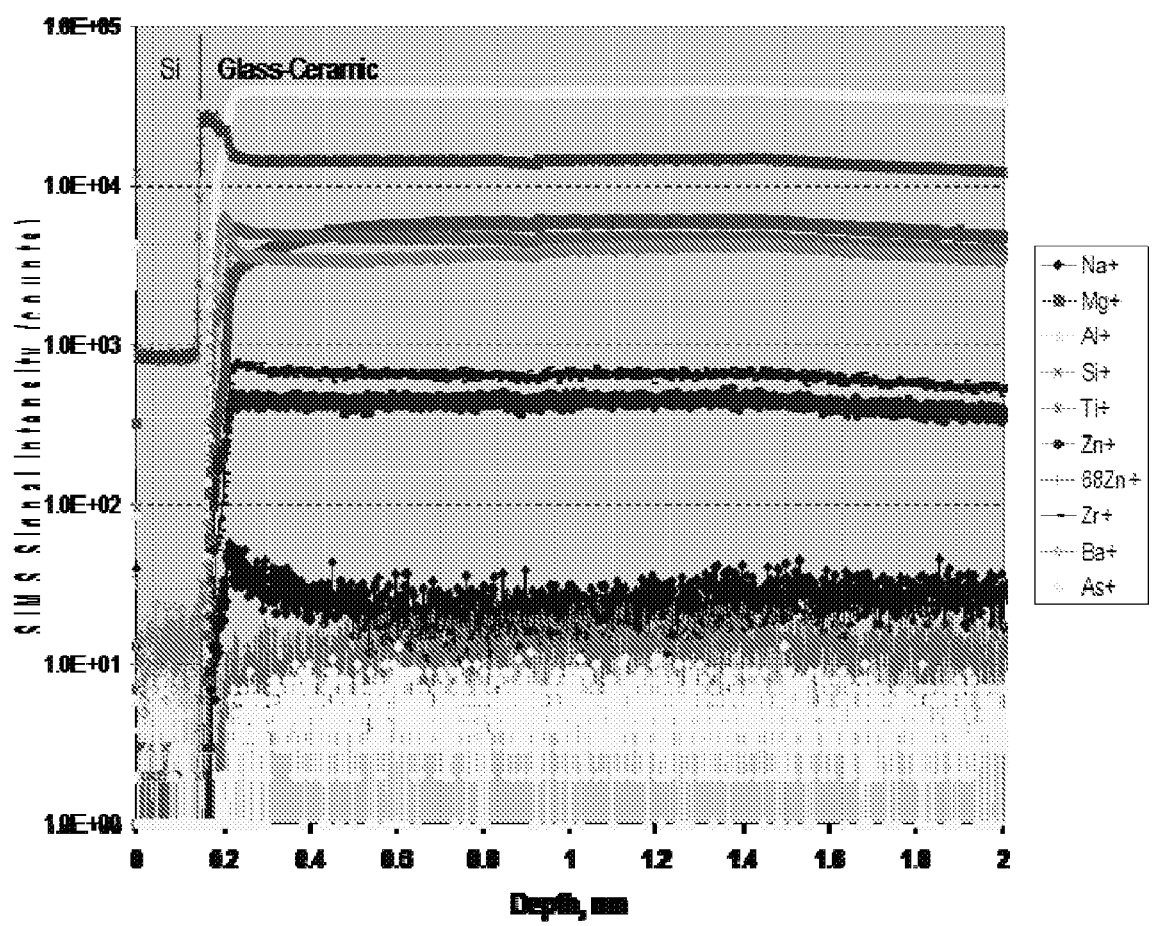
FIG. 7 is a TOF-SIMs depth profile of a semiconductor-on-glass structure of the type detailed in the Example and made in accordance with the invention described herein.

The results of this ToF-SIMS analysis are shown in FIG. 7. The following can be observed in an examination of FIG. 7: (1)) an oxide glass layer beginning at a depth of 0.15 nm (designated as AA) and ending at a depth of about 0.175 nm (designated as BB); (2) a first glass-ceramic layer, beginning at a depth of 0.175 (designated as BB) and ending at a depth of 0.3 nm (designated CC), having an enhanced positive ion concentration of modifier positive ions, including at least one alkaline earth modifier ion from the first glass-ceramic layer; and (2) a second glass-ceramic layer, beginning at about a depth of 0.3 nm, exhibiting the bulk glass composition.

Figure 8:
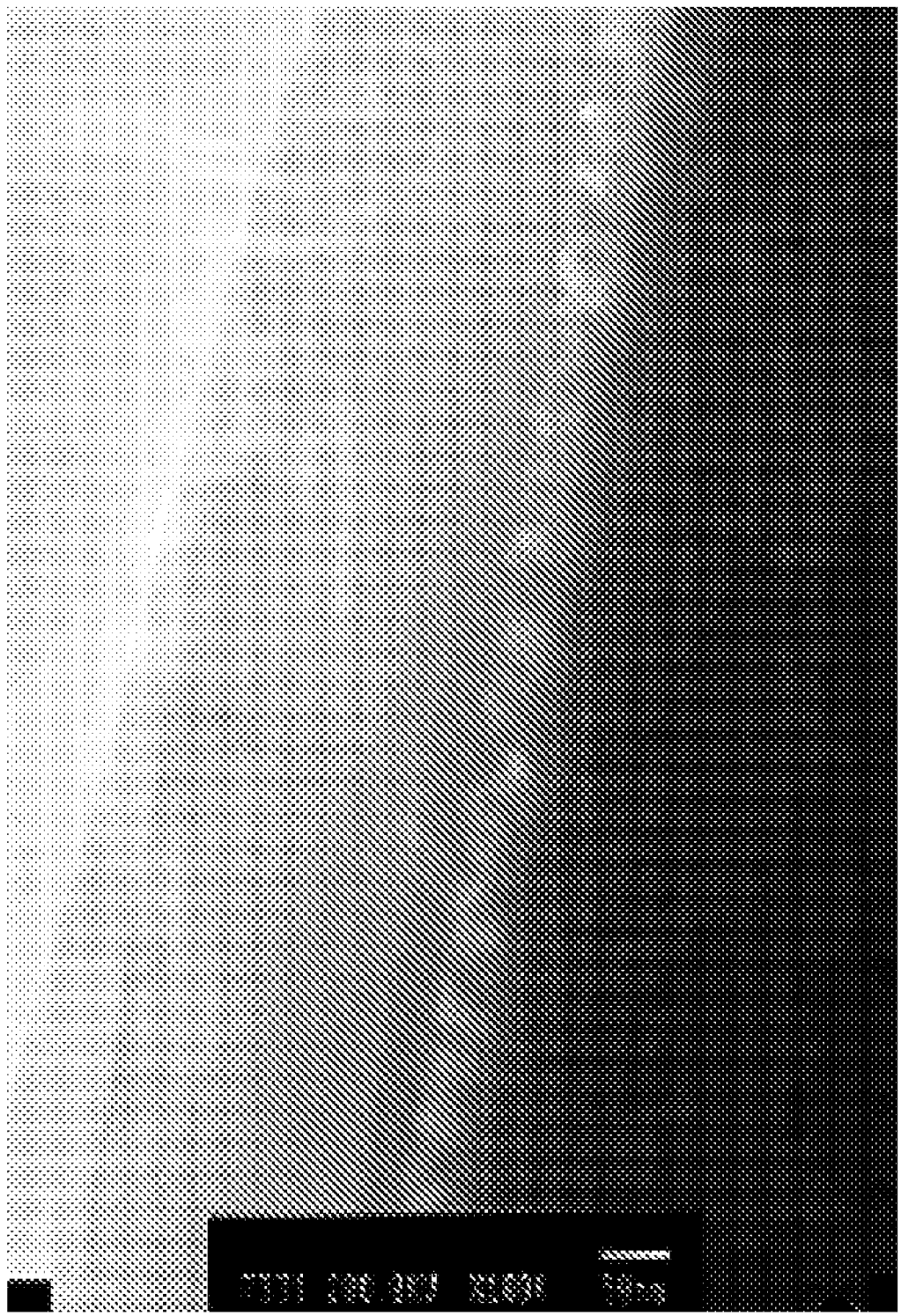
FIG. 8 is a TEM micrograph of a semiconductor-on-glass structure of the type detailed in the Example and made in accordance with the invention described herein

With reference to FIG. 8, the silicon on glass-ceramic structure so-produced by the techniques above was subjected to a TEM analysis using a JEOL instrument model JEM-2000 F at 200 KV, where the magnification was 100 K. An examination of the silicon/glass ceramic interface illustrated in the TEM micrograph shows the presence of a glassy barrier layer between the silicon and the crystallized glass-ceramic layers as is evident to skilled artisans.

Figure 9:
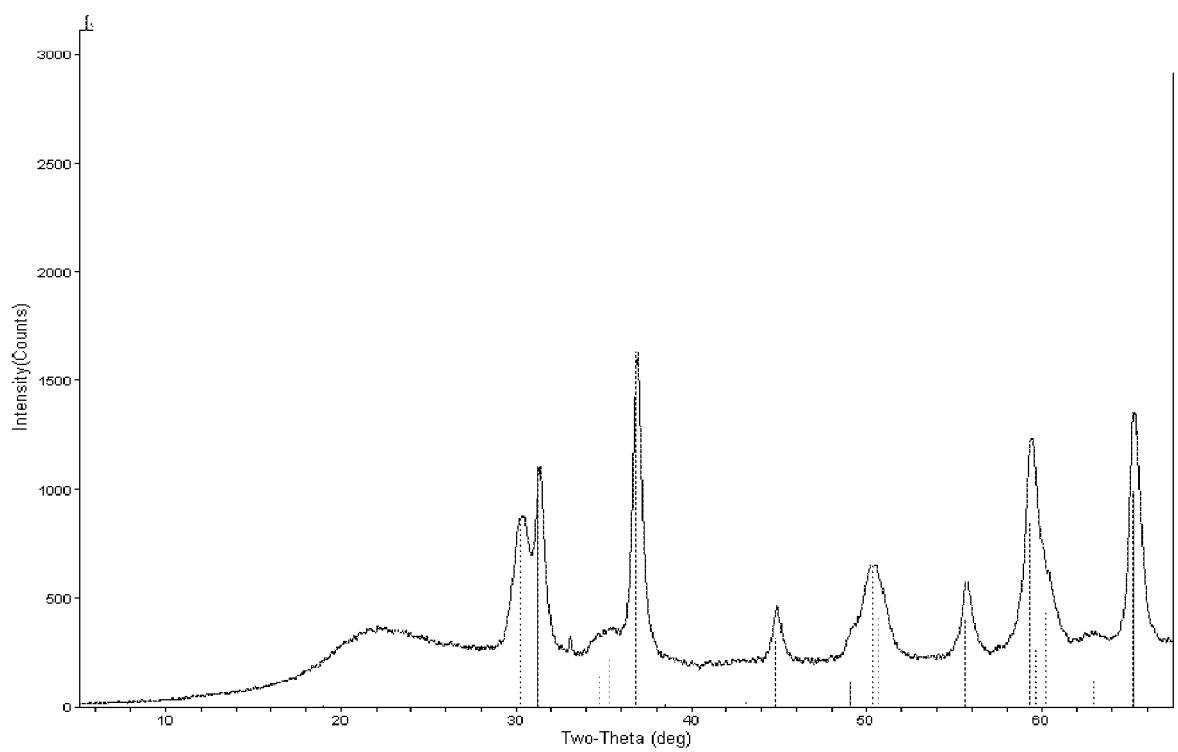
FIG. 9 illustrates an X ray diffraction pattern of a semiconductor-on-glass structure detailed in the Example and made in accordance with the invention described herein.

Finally the silicon on glass-ceramic structure so-produced by the techniques above was subjected to an x-ray diffraction analysis in accordance with well-known techniques understood by skilled artisans. An examination of the resultant x-ray diffraction pattern in FIG. 9 illustrates the presence of fine crystallite size and a spinel gahnite and zirconium oxide phases. Indeed, the peak at 2.95A (closest to 30 degrees two-theta) is a main peak for ZrO2.

It will be apparent to those skilled in the art that various modifications and variations can be made to the present invention without departing from the spirit and scope of the invention. Thus, it is intended that the present invention cover the modifications and variations of this invention provided they come within the scope of the appended claims and their equivalents.

What is claimed is:

1. A semiconductor-on-insulator layered structure comprising the following:
 a substrate including a non-laminated oxide glass material layer and glass-ceramic layer; and
 a semiconductor material component comprising a substantially single-crystal semiconductor material layer and a single-crystal semiconductor material with an enhanced oxygen content layer, the semiconductor material component coupled to the substrate.

2. The semiconductor-on-insulator structure of claim 1 wherein the glass ceramic further comprises a first layer having an enhanced positive ion concentration of modifier positive ions, including at least one alkaline earth modifier ion from the oxide glass material layer; and a second layer comprising bulk glass-ceramic.

3. The semiconductor-on-insulator structure of claim 1, wherein the oxide glass and the glass-ceramic comprises positive ions of one or more types, wherein the sum of lithium, sodium and potassium ions in the glass or glass-ceramic on an oxide basis is less than about 5 weight percent.

4. The semiconductor-on-insulator structure of claim 1, wherein the oxide glass and the glass-ceramic is free of alkali ions.

5. The semiconductor-on-insulator structure of claim 1, wherein the glass-ceramic comprises a spinel or mullite crystal phase.

6. The semiconductor-on-insulator structure of claim 1, wherein the oxide glass and the glass-ceramic exhibits a coefficient of thermal expansion between about $22\text{-}42 \times 10^{-7}/°C$. over the temperature range of 25-300° C.

7. The semiconductor-on-insulator structure of claim 1, wherein the oxide glass and the glass-ceramic exhibits a coefficient of thermal expansion between about $35\text{-}40 \times 10^{-7}/°C$. over the temperature range of 25-300° C.

8. The semiconductor-on-insulator structure of claim 1, wherein the semiconductor material is a silicon-based semiconductor material and is selected from the group consisting of undoped silicon, n-doped silicon, p-doped silicon, germanium-doped silicon (SiGe) and silicon carbide (SiC).

9. The semiconductor-on-insulator structure of claim 1 wherein the semiconductor material is selected from the group consisting of Ge, GeAs, GaP, and InP-based materials.

10. The semiconductor-on-insulator structure of claim 6, wherein the glass-ceramic is a transparent silicate based glass-ceramic having predominant crystal phase of spinel crystal phase and having a composition comprising, in terms of weight percent on the oxide basis: in weight percent on an oxide basis: 55-65% $SiO_2$, 15-25% $Al_2O_3$, 6-15% ZnO, 0-6% MgO, 0-10% $TiO_2$, 0-10% ZrO, 0-15% $Cs_2O$, 0-5% BaO, ZnO+MgO in combination being greater than or equal to about 8%, and $TiO_2+ZrO_2$ in combination being greater than about 4%.

11. The semiconductor-on-insulator structure of claim 1, wherein the bond strength between the semiconductor material and the oxide glass material is at least 8 $J/m^2$.

12. A semiconductor-on-insulator layered structure comprising a substantially single-crystal semiconductor material and an oxide containing material:
 wherein the semiconductor material comprises a single crystal semiconductor material layer and a layer comprising a single crystal semiconductor material with an enhanced oxygen content; and,
 wherein the oxide containing material includes a non-laminated: (i) oxide glass material layer, with a reduced positive ion concentration having substantially no modifier positive ions, (ii) glass-ceramic layer, with an enhanced positive ion concentration of modifier positive ions, including at least one alkaline earth modifier ion from the oxide glass material layer with a reduced positive ion concentration, and (iii) bulk glass-ceramic material layer.

13. The semiconductor-on-insulator structure of claim 12, wherein the oxide containing material comprises positive ions of one or more types, wherein the sum of lithium, sodium and potassium ions in the glass or glass-ceramic on an oxide basis is less than about 2 weight percent.

14. The semiconductor-on-insulator structure of claim 12, wherein the oxide containing material is free of alkali ions.

15. The semiconductor-on-insulator structure of claim 12, wherein the glass-ceramic comprises a spinel or mullite crystal phase.

16. The semiconductor-on-insulator structure of claim 12, wherein the oxide-containing material exhibits a coefficient of thermal expansion between about $22\text{-}42 \times 10^{-7}/°C$. over the temperature range of 25-300° C.

17. The semiconductor-on-insulator structure of claim 12, wherein the oxide-containing material exhibits a coefficient of thermal expansion between about $35\text{-}40 \times 10^{-7}/°C$. over the temperature range of 25-300° C.

18. The semiconductor-on-insulator structure of claim 12, wherein the semiconductor material is a silicon-based semiconductor material and is selected from the group consisting of undoped silicon, n-doped silicon, p-doped silicon, germanium-doped silicon (SiGe) and silicon carbide (SiC).

19. The semiconductor-on-insulator structure of claim 12 wherein the semiconductor material is selected from the group consisting of Ge, GeAs, GaP, and InP-based materials.

20. The semiconductor-on-insulator structure of claim 16, wherein the oxide-containing material has a composition comprising, in terms of weight percent on the oxide basis: in weight percent on an oxide basis: 55-65% $SiO_2$, 15-25% $Al_2O_3$, 6-15% ZnO, 0-6% MgO, 0-10% $TiO_2$, 0-10% ZrO, 0-15% $Cs_2O$, 0-5% BaO, ZnO+MgO in combination being greater than or equal to about 8%, and $TiO_2+ZrO_2$ in combination being greater than about 4%.

21. The semiconductor-on-insulator structure of claim 12, wherein the bond strength between the semiconductor material and the oxide-containing material is at least 8 $J/m^2$.

22. A method of forming a semiconductor on glass-ceramic structure, comprising:
 (a) subjecting an implantation surface of a donor semiconductor wafer to an ion implantation process to create an exfoliation layer of the donor semiconductor wafer;
 (b) bonding the implantation surface of the exfoliation layer to a precursor glass substrate using electrolysis;
 (c) separating the exfoliation layer from the donor semiconductor wafer to thereby form an intermediate semiconductor on precursor glass structure; and
 (d) subjecting the intermediate semiconductor on precursor glass structure to heat-treatment step to crystallize the precursor glass resulting in the formation of a semiconductor on glass-ceramic structure,
 wherein the resulting structure comprises: a substrate including a non-laminated oxide glass material layer and glass-ceramic layer; and a semiconductor material component having a substantially single-crystal semiconductor material layer and a single-crystal semiconductor material with an enhanced oxygen content layer, the semiconductor material component being bonded to the substrate.

23. The method of claim 22 wherein the step of bonding includes:
   heating at least one of the glass substrate and the donor semiconductor wafer;
   bringing the precursor glass substrate into direct or indirect contact with the donor semiconductor wafer through the exfoliation layer; and
   applying a voltage potential across the precursor glass substrate and the donor semiconductor wafer to induce the bond.

24. The method of claim 23, wherein the temperature of the precursor glass substrate and the semiconductor wafer are elevated to within about 150° C. of the strain point of the glass substrate.

25. The method of claim 23, wherein the temperatures of the precursor glass substrate and the semiconductor wafer are elevated to different levels.

26. The method of claim 23, wherein the voltage potential across the precursor glass substrate and the semiconductor wafer is between about 100 to 2000 volts.

27. The method of claim 22, wherein the donor semiconductor wafer is selected from the group consisting of: silicon (Si), germanium-doped silicon (SiGe), silicon carbide (SiC), germanium (Ge), gallium arsenide (GaAs), GaP, and InP.

28. The method of claim 22, wherein the precursor glass and the glass-ceramic exhibits a coefficient of thermal expansion between about $22\text{-}42 \times 10^{-7}/°$ C. over the temperature range of 25-300° C. and the glass-ceramic comprises a spinel or mullite crystal phase.

* * * * *